United States Patent
Henson

[11] Patent Number: 6,158,014
[45] Date of Patent: Dec. 5, 2000

[54] AUTOMATIC DETECTION OF 8B/10B DATA RATES

[75] Inventor: Karl M. Henson, Rancho Santa Margarita, Calif.

[73] Assignee: Emulex Corporation, Costa Mesa, Calif.

[21] Appl. No.: 09/204,669

[22] Filed: Dec. 2, 1998

[51] Int. Cl.[7] .................................................. G06F 13/00
[52] U.S. Cl. ............................................. 713/501; 709/233
[58] Field of Search .................................... 713/400, 500, 713/501, 600; 709/200, 220, 250, 232, 233; 710/58, 60, 61; 370/254

[56] References Cited

U.S. PATENT DOCUMENTS

| | | | |
|---|---|---|---|
| 5,442,629 | 8/1995 | Geyer et al. | 370/252 |
| 5,495,580 | 2/1996 | Osman . | |
| 5,522,047 | 5/1996 | Grow et al. . | |
| 5,590,159 | 12/1996 | Anderson | 375/340 |
| 5,638,512 | 6/1997 | Osman et al. . | |
| 5,659,718 | 8/1997 | Osman et al. . | |

OTHER PUBLICATIONS

Fiber Channel Tutorial, http://www.fibrechannel.com/technology/tutorial.htm.

Fibre Channel Overview, http://www.cern.ch/HSI/fcs/spec/overview.htm.

Fibre Channel Glossary, http://www.iol.unh.edu/training/fc/fcglossary.html.

*Primary Examiner*—Thomas M. Heckler
*Attorney, Agent, or Firm*—Fish & Richardson P.C.

[57] ABSTRACT

Methods and apparatus for implementing a technique for determining a data rate of a serial bitstream using pattern recognition and for matching a clock speed of a deserializer to that data rate. In one implementation, a port for connecting a network device to a network includes a data input for receiving a bitstream from a network, where the bitstream has a data rate; a deserializer connected to the data input, where the deserializer deserializes the bitstream received via the data input, generating data characters; and a network device connected to the deserializer, where the network device receives data characters from the deserializer and determines the data rate of the bitstream by recognizing patterns in the data characters generated by the deserializer. In another implementation, a node port also sets a clock speed of the deserializer to match the data rate of the bitstream.

17 Claims, 3 Drawing Sheets

AUTOMATIC DETECTION OF 8B/10B DATA RATES

TECHNICAL FIELD

The present invention relates to electronic network communications systems, and more specifically to determining the speed of an incoming bitstream.

BACKGROUND INFORMATION

Electronic data systems are frequently interconnected using network communication systems. Area-wide networks and channels are two approaches that have been developed for computer network architectures. Traditional networks (e.g., LAN's and WAN's) offer a great deal of flexibility and relatively large distance capabilities. Channels, such as the Enterprise System Connection (ESCON) and the Small Computer System Interface (SCSI), have been developed for high performance and reliability. Channels typically use dedicated short-distance connections between computers or between computers and peripherals.

Features of both channels and networks have been incorporated into a new network standard known as "Fibre Channel". Fibre Channel systems combine the speed and reliability of channels with the flexibility and connectivity of networks. Fibre Channel products currently can run at very high data rates, such as 1062 Mbps. These speeds are sufficient to handle quite demanding applications, such as uncompressed, full motion, high-quality video. ANSI specifications, such as X3.230-1994, define the Fibre Channel network. This specification distributes Fibre Channel functions among five layers. The five functional layers of the Fibre Channel are: FC-0—the physical media layer; FC-1—the coding and encoding layer; FC-2—the actual transport mechanism, including the framing protocol and flow control between nodes; FC-3—the common services layer; and FC-4—the upper layer protocol.

There are generally three ways to deploy a Fibre Channel network: simple point-to-point connections; arbitrated loops; and switched fabrics. The simplest topology is the point-to-point configuration, which simply connects any two Fibre Channel systems directly. Arbitrated loops are Fibre Channel ring connections that provide shared access to bandwidth via arbitration. Switched Fibre Channel networks, called "fabrics", are a form of cross-point switching.

Connections between devices in a Fibre Channel network are referred to as links. Data is transmitted across links between devices in a serial bitstream. The serial bitstream is encoded using an eight-bit/ten-bit ("8B/10B") encoding scheme. The bitstream includes a series of 10 bit characters. The devices typically deserialize and decode the incoming 10 bit characters to 8 bit characters and then serialize and encode outgoing data back to 10 bit characters. Accordingly, each Fibre Channel protocol device includes a "serdes" device for serializing and deserializing data to and from the device's link. For example, when a device outputs data onto a link, the device's serdes serializes the data from the device into a serial bitstream. When receiving data from a link, the device's serdes deserializes the serial bitstream on the link into ten-bit characters. These characters are then gathered into four character words.

When a Fibre Channel node port is properly connected to an active Fibre Channel link, the node port receives a stream of data words and Fibre Channel ordered set words (e.g., primitive signals, primitive sequences, and frame delimiters). Each ordered set word includes four ten-bit characters. The first ten-bit character is defined to be a special character known as the "K28.5" character. For all primitive signals and primitive sequences, the K28.5 ten-bit character is a "K28.5+" character. The K28.5+ character is encoded as 0x0FA, i.e., 0011111010. The first seven bits of this character correspond to a pattern referred to as the "comma pattern", 0011111. The deserializer within a commodity serdes device uses the comma pattern to synchronize the deserialization process to ten-bit character boundaries in the bitstream.

The inventor has determined that it would be desirable to provide apparatus and methods internal to the node port for determining the data rate of the incoming bitstream and also to provide the capability to set the clock speed of the deserializer to match that data rate.

SUMMARY

The invention provides methods and apparatus for implementing a technique for determining a data rate of a serial bitstream using pattern recognition and for matching a clock speed of a deserializer to that data rate. In one implementation, a port for connecting a network device to a network includes a data input for receiving a bitstream from a network, where the bitstream has a data rate; a deserializer connected to the data input, where the deserializer deserializes the bitstream received via the data input, generating data characters; and a network device connected to the deserializer, where the network device receives data characters from the deserializer and determines the data rate of the bitstream by recognizing patterns in the data characters generated by the deserializer.

In another implementation, a node port also selects a data rate for the deserializer to match the data rate of the bitstream. The node port includes a data input for receiving a bitstream from a network, where the bitstream has a data rate; a deserializer connected to the data input, where the deserializer deserializes the bitstream received via the data input, generating data characters, and where the deserializer is capable of operating at more than one clock speed; and a network device connected to the deserializer, where the network device determines the data rate of the bitstream by recognizing patterns in data characters received from the deserializer and sends control signals to the deserializer to set the clock speed of the deserializer to match the data rate of the bitstream.

In a Fibre Channel implementation, a Fibre Channel node port for connecting a Fibre Channel protocol device to a Fibre Channel network includes a data input for receiving a bitstream from a Fibre Channel network, where the bitstream has a data rate; a deserializer connected to the data input, where the deserializer deserializes the bitstream received via the data input, generating 10-bit data characters, and where the deserializer is capable of operating at more than one clock speed; and a Fibre Channel protocol device connected to the deserializer, where the Fibre Channel protocol device receives the data characters from the deserializer and sends clock control signals to the deserializer to set the clock speed of the deserializer to match the data rate of the bitstream.

In another implementation, a bitstream of data is received at a deserializer. The bitstream is deserialized into data characters. Finally, patterns in the data characters are recognized to determine a data rate of the bitstream.

In another implementation, a clock speed of a deserializer is set to a maximum speed. A bitstream of data is received at a deserializer. The bitstream is deserialized into data characters. Patterns in the data characters are recognized to determine a data rate of the bitstream. The clock speed of the deserializer is then set to match the data rate of the bitstream based on the recognized patterns.

The technique of the present invention provides several advantages. By allowing the Fibre Channel node port to positively identify the transmission data rate of the received serial bitstream, determination by trial and error is avoided. The node port is also able to distinguish between a non-functional connection and an incorrectly configured link connection by checking the pattern of the received bitstream (i.e., typically, a non-functional connection does not generate a recognizable pattern). By recognizing certain patterns in the deserialized data stream, the node port can quickly determine the data rate of the received serial bitstream and provide a definite indication to the controlling protocol of the data rate of the transmitter of the link data. Because the node port can set the deserializer clock speed to match the determined data rate of the serial bitstream, Fibre Channel devices which can operate at more than one data rate can be deployed and such devices are backwards compatible with the currently installed base Fibre Channel networks that typically run at a link rate of 1.0625 giga-bits per second ("Gbps").

DETAILED DESCRIPTION

The invention provides methods and apparatus for implementing a technique for determining a data rate of a serial bitstream using pattern recognition and for matching a clock speed of a deserializer to that data rate. The invention is explained below in the context of a Fibre Channel network as an illustration of a preferred implementation. However, the invention may have applicability to networks with similar characteristics to Fibre Channel networks. For example, the invention is applicable to other networks which use an 8B/10B encoding scheme, such as Gigabit ethernet and NGIO.

In a preferred implementation, a deserializer in a port connected to a network receives a serial bitstream. The deserializer synchronizes to the character boundaries in the bitstream using a specified pattern. The deserializer then generates a series of multiple-bit width characters from the serial bitstream. The deserializer supplies these characters to pattern recognition logic in a network device. The pattern recognition logic examines the characters received by the deserializer to find certain patterns corresponding to available data rates of the network device. Using these patterns, the network device determines the data rate of the serial bitstream. In addition, in one implementation, the network device uses the determined data rate of the serial bitstream to adjust the clock speed of the deserializer to match the data rate of the bitstream.

Figure 1:
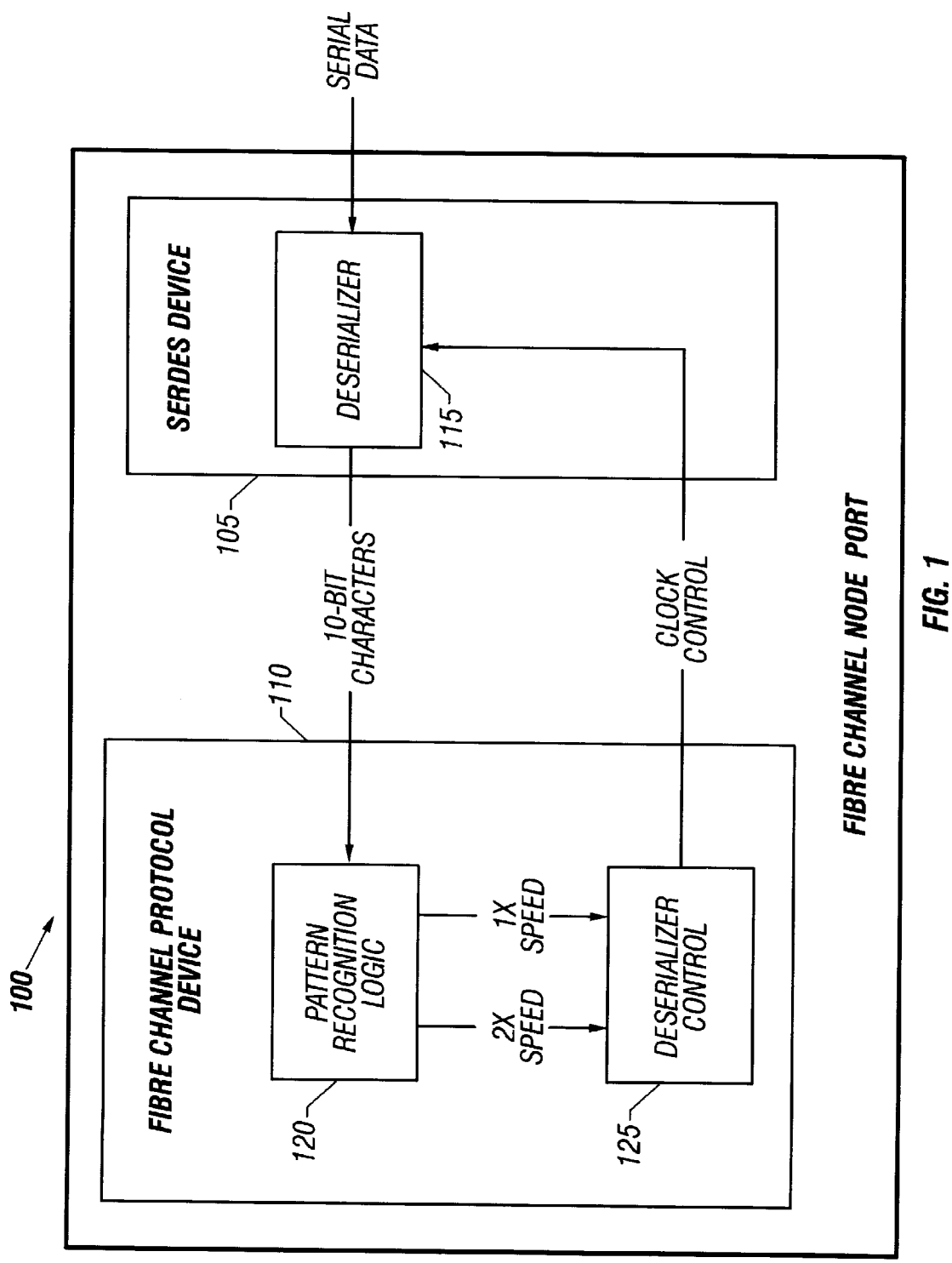
FIG. 1 shows a Fibre Channel node port according to the invention.

FIG. 1 shows a Fibre Channel implementation of a Fibre Channel node port 100 according to the invention. The Fibre Channel node port 100 includes a serializer/deserializer ("serdes") device 105 and a connection to a Fibre Channel protocol device 110 (i.e., a network device which operates in compliance with Fibre Channel protocols.) The serdes device 105 includes a deserializer 115. The deserializer 115 receives a serial bitstream of data from a connected network. The deserializer 115 synchronizes to character boundaries in the serial bitstream and generates multiple bit characters, as described below. In a Fibre Channel implementation, the deserializer generates ten-bit characters. The deserializer 115 supplies the characters to pattern recognition logic 120 in the Fibre Channel protocol device 110. The pattern recognition logic 120 determines the data rate of the serial bitstream by recognizing predefined patterns in the characters received from the deserializer 115, as described below. The pattern recognition logic 120 sends control signals to a deserializer control circuit 125 indicating the determination of the data rate of the serial bitstream. FIG. 1 shows an implementation where the node port 100 is capable of operating at two speeds, "2×" and "1×" (e.g., approximately 2 Gbps and 1 Gpbs, respectively). In alternative implementations, the node port can be designed to accommodate more speeds and at different ratios than a factor of two. When the pattern recognition logic 120 recognizes a first pattern in the characters received from the deserializer 115, the pattern recognition logic 120 sends a first speed control signal (i.e., 2×) to the deserializer control circuit 125. When the pattern recognition logic 120 recognizes a second pattern in the characters received from the deserializer 115, the pattern recognition logic sends a second speed control signal (i.e., 1×) to the deserializer control circuit 125.

The deserializer control circuit 125 sends a clock control signal back to the deserializer 115 to adjust the clock speed of the deserializer 115. The clock control signal sets the clock speed of the deserializer 115 to match the determined data rate of the serial bitstream.

In an alternative implementation, the Fibre Channel protocol device 110 does not include a deserializer control circuit 125. In such an implementation, the Fibre Channel protocol device 110 receives an output signal from the pattern recognition logic 120 indicating the data rate of the serial bitstream. The Fibre Channel protocol device 110 uses the signal as appropriate according to the application.

The determination of the data rate of the bitstream is based upon pattern recognition in the multiple-bit characters output by the deserializer. When the deserializer is running at a clock speed which matches the data rate of the serial bitstream, the output of the deserializer matches the received serial bitstream. However, when the deserializer is running at a clock speed higher than the data rate of the serial bitstream, the deserializer introduces additional bits as the deserializer generates multiple clock pulses for each bit in the supplied bitstream and so reads in the same bit multiple times. Thus, in cases where the data rate is slower than the clock speed of the deserializer, the pattern of bits in the perceived bitstream expand proportionately to the ratio of the clock speed to the data rate. For example, when the clock speed is three times the data rate, each bit in the bitstream appears three times in the bitstream perceived by the deserializer.

In an example of a Fibre Channel implementation, assume the deserializer receives the following bitstream:

00001111101010101000101010101010101010100011111010

When the deserializer is running at a clock rate the same as the data rate of the bitstream, the clock pulses of the deserializer match the data rate of the bitstream and so the deserializer receives one bit for each bit in the bitstream. The deserializer finds the comma pattern and outputs the following ten-bit characters:

| | |
|---|---|
| 0011111010 | (0 × 0FA) |
| 1010100010 | (0 × 2A2) |
| 1010101010 | (0 × 2AA) |
| 1010101010 | (0 × 2AA) |
| 0011111010 | (0 × 0FA) |

When the deserializer is running at a clock speed twice the data rate of the serial bitstream, the deserializer generates two clock pulses for each bit in the bitstream and so the deserializer perceives each bit in the bitstream twice. Hence, the deserializer perceives the above bitstream as the following bitstream:

00000000111111111001100110011001100000011001100 1100110011001100 11001100110000001111111111001100

As a result, the deserializer finds a comma pattern and outputs the following ten-bit characters:

| | |
|---|---|
| 0011111111 | (0 × 0FF) |
| 1100110011 | (0 × 333) |
| 0011001100 | (0 × 0CC) |
| 0000110011 | (0 × 033) |
| 0011001100 | (0 × 0CC) |
| 1100110011 | (0 × 333) |
| 0011001100 | (0 × 0CC) |
| 1100110000 | (0 × 330) |
| 0011111111 | (0 × 0FF) |
| 1100110011 | (0 × 333) |

Thus, the resulting characters are very different. However, this difference is predictable based upon the relationship of the clock speed and the data rate. Notably, the first 18 bits output by the deserializer in the second case are the same as doubling the bits in the lower nine bits in the first charcter in the first case. Similar patterns hold for different ratios of speeds.

Figure 2:
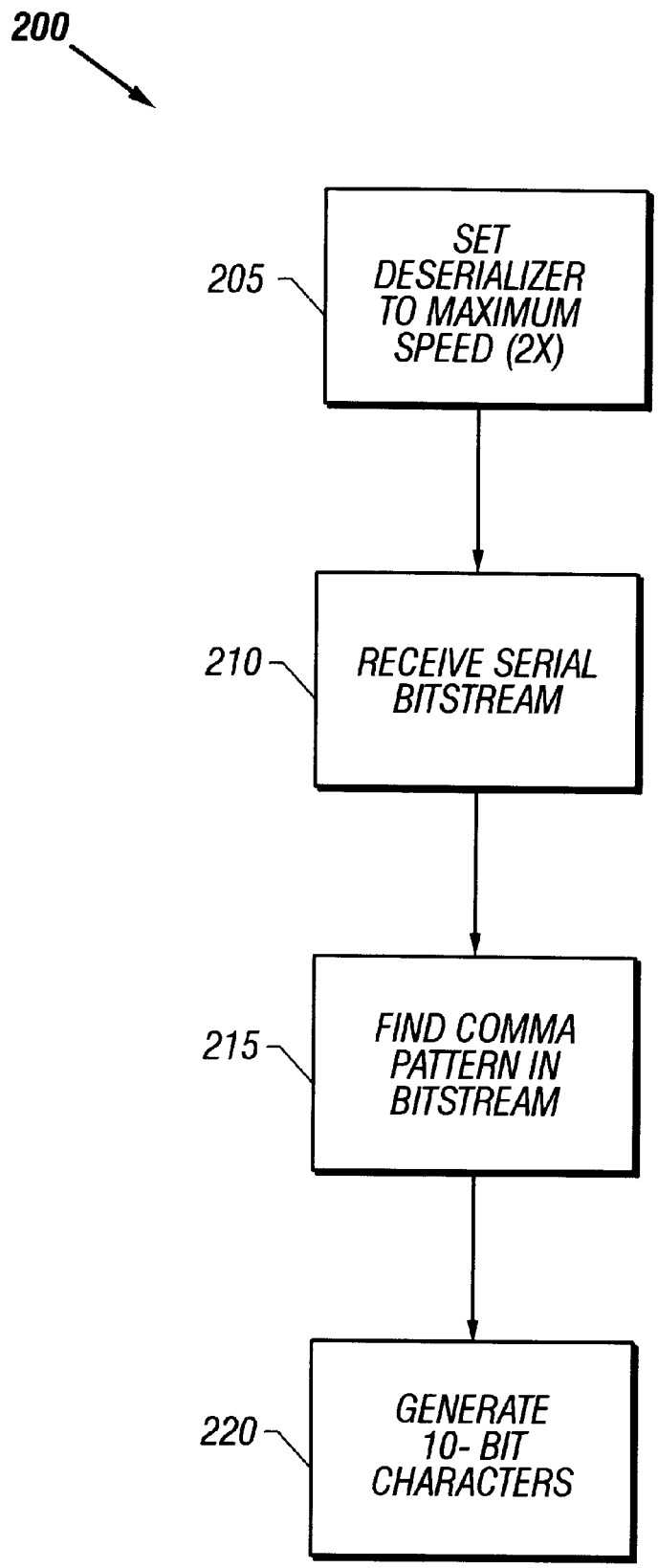
FIG. 2 is a flow chart of the operation of a deserializer.

FIG. 2 shows a process 200 of synchronizing the deserializer to the character boundaries of the serial bitstream. The Fibre Channel protocol device sets the clock speed of the deserializer to a maximum speed (e.g., 2x) (step 205). The deserializer receives a stream of bits as a serial bitstream from the connected network (step 210). The deserializer examines the incoming bitstream to find a predefined pattern (step 215). This pattern is predefined to indicate a special character according to the network protocol of the network. In a Fibre Channel implementation this pattern is the comma pattern. The comma pattern is unique and only used to indicate a K28.5 character at the beginning of an ordered set word. After the deserializer has found the predefined pattern in the bitstream, the deserializer outputs multiple bit characters using the predefined pattern as a starting point (step 220). In a Fibre Channel implementation, the comma pattern is a seven bit pattern. The next three bits in the bitstream complete the character including the comma pattern. Accordingly, the deserializer can conclude that the comma pattern plus the succeeding three bits form a proper ten-bit character. The deserializer passes these ten bits to the Fibre Channel protocol device as a character. The deserializer passes succeeding groups of ten bits from the serial bitstream to the Fibre Channel protocol device as succeeding characters and so is synchronized to ten-bit character boundaries in the bitstream.

For a node port capable of running at multiple speeds, such as approximately 1 Gbps (1x) and 2 Gbps (2x), the node port can quickly determine the data rate of the received serial bitstream by configuring the deserializer to the maximum clock rate (i.e., 2x) and then waiting to see what speed of K28.5+ character is detected by the pattern recognition logic. If the 2x speed K28.5+ character is detected, the deserializer is correctly configured, matching the data rate of the bitstream, and so the Fibre Channel protocol device does not change the configuration of the deserializer. If the 1x speed K28.5+ character is detected, the Fibre Channel protocol device configures the deserializer to run at the lower 1x clock rate before attempting to establish communication on the link. If no K28.5+ characters are detected at any available speed, the pattern recognition logic determines that the link is effectively nonfunctional.

Figure 3:
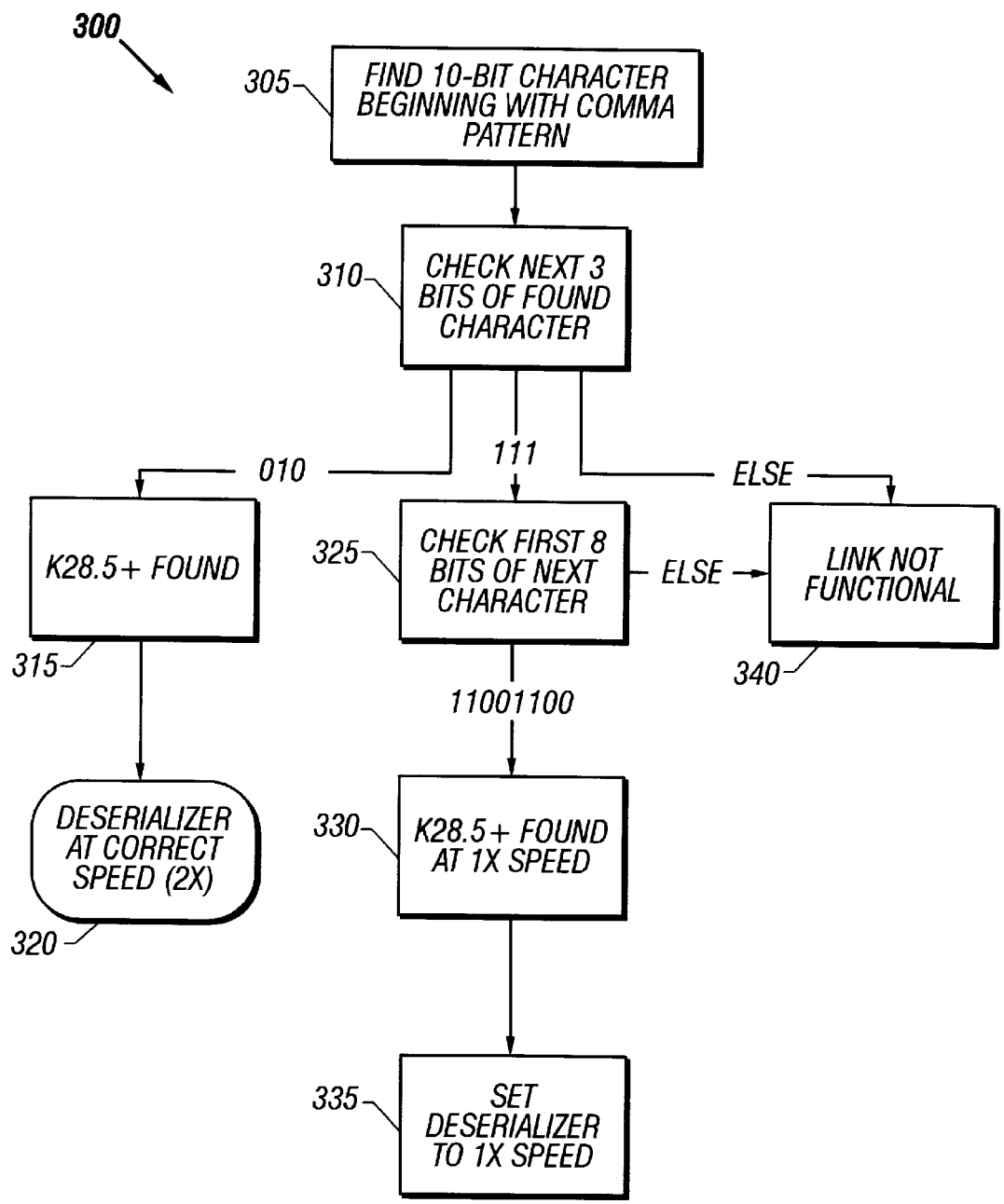
FIG. 3 is a flow chart of matching the speed of the deserializer to the data rate of an incoming bitstream.

FIG. 3 shows a process 300 of setting the clock speed of the deserializer to match the data rate of the serial bitstream. FIG. 3 describes this process in terms of a Fibre Channel implementation. However, the details described below, such as the number of bits in a character or the content of the patterns used to recognize the data rate of the serial bitstream, can be changed to accommodate alternative network protocols and applications. After the deserializer has synchronized to both the bit and character boundaries of the serial bitstream, the pattern recognition logic looks for a ten-bit character where the upper seven bits are the seven bit comma pattern (step 305). The pattern recognition logic then checks the lower three bits of that character (step 310). If these three bits are 010, then this character is a K28.5+ character (step 315). The data rate of the received serial bitstream is the same as the clock speed of the deserializer, and the Fibre Channel protocol device does not need to adjust the clock speed of the deserializer (step 320). The pattern recognition logic recognizes that the deserializer and the serial bitstream are at the same rate because the deserializer generated a ten-bit character corresponding to the ten-bit code for the K28.5+ character.

If the lower three bits of the character found by the pattern recognition logic which includes the comma pattern are 111, the pattern recognition logic recognizes that the deserializer is running at a speed higher than the data rate of the serial bitstream. The pattern recognition logic then checks the upper eight bits of the following ten-bit character (step 325). If these upper eight bits are 11001100, the pattern recognition logic recognizes that a K28.5+ in the serial bitstream has been serialized by the deserializer at a clock speed double the data rate of the serial bitstream (step 330). The pattern recognition logic sends a speed control signal to the deserializer control circuit, which in turn sends a clock control signal to the deserializer to reduce the deserializer clock speed by one half (e.g., from 2x to 1x) (step 335). The pattern recognition logic recognizes that the deserializer is operating at double the data rate of the serial bitstream because the deserializer has sent a sequence of 18 bits (ten in the first word and eight in the following word) representing the ten bits of the K28.5+ character. The deserializer sends 18 bits rather than 20 bits because the initial zero of the K28.5 is lost in the recognition of the comma pattern by the deserializer. This loss results from the lack of recognition by the deserializer that the deserializer is in fact running at twice the data rate of the serial bitstream.

If the lower three bits of the character found by the pattern recognition logic to contain the comma pattern are neither 010 nor 111, the pattern recognition logic recognizes that the link is not transmitting a functional serial bitstream (step 340). The pattern recognition logic also recognizes that the link is not functional when the upper eight bits of the succeeding character from step 325 are not 11001100 (step 340).

In an alternative implementation, the same concept of that described above with respect to FIG. 3 can be applied to applications with alternative multiple data rates and clock speeds. For example, the pattern recognition logic can recognize that the serial bitstream is operating at a data rate corresponding to the maximum clock speed of the deserializer, half of the maximum clock speed of the deserializer, or one quarter of the maximum clock speed of the deserializer. In order to accommodate such alternative data rates, the pattern recognition logic includes corresponding bit patterns and decision making to fully recognize such alternative data rates. In another alternative implementation, the pattern recognition logic described above is included in the deserializer of the serdes device.

A preferred implementation has been described along with several alternative implementations. However, variations which fall within the scope of the following claims are within the scope of the present invention. For example, the technique can be implemented in programmable hardware or software. Accordingly, the present invention is not limited to the implementations described above but only by the scope of the following claims.

What is claimed is:

1. A port for connecting a network device to a network, the port comprising:
    (a) a data input for receiving a bitstream from a network, where the bitstream has a data rate;
    (b) a deserializer connected to the data input, where the deserializer deserializes the bitstream received via the data input, generating data characters, and where the deserializer is capable of operating at more than one clock speed; and
    (c) a network device connected to the deserializer, where the network device determines the data rate of the bitstream by recognizing patterns in data characters received from the deserializer and sends control signals to the deserializer to set the clock speed of the deserializer to match the data rate of the bitstream.

2. The port of claim 1, where the network is a Fibre Channel network.

3. The port of claim 1, where the network uses an 8B/10B encoding scheme.

4. The port of claim 1, where the deserializer can operate at clock speeds which are compatible with data rates which are multiples of 1.0625 giga-bits per second.

5. The port of claim 1, where the network device includes:
    (a) pattern recognition logic for receiving the data characters and determining which clock speed corresponds to the data rate of the bitstream, generating control signals indicating the data rate of the bitstream; and
    (b) a deserializer control circuit connected to the pattern recognition logic and to the deserializer, where the deserializer control circuit receives the control signals from the deserializer control circuit, and where the deserializer control circuit sends clock control signals to the deserializer to set the clock speed of the deserializer according to the control signals from the deserializer control circuit.

6. The port of claim 5, where the pattern recognition logic recognizes a K28.5 character to determine the data rate of the bitstream.

7. A node port for connecting a Fibre Channel protocol device to a Fibre Channel network, the node port comprising:
    (a) a data input for receiving a bitstream from a Fibre Channel network, where the bitstream has a data rate;
    (b) a deserializer connected to the data input, where the deserializer deserializes the bitstream received via the data input, generating 10-bit data characters, and where the deserializer is capable of operating at more than one clock speed; and
    (c) a Fibre Channel protocol device connected to the deserializer, where the Fibre Channel protocol device receives the data characters from the deserializer and sends clock control signals to the deserializer to set the clock speed of the deserializer to match the data rate of the bitstream.

8. The port of claim 7, where the Fibre Channel protocol device determines the data rate of the bitstream by recognizing patterns in the data characters generated by the deserializer.

9. The port of claim 7, where the Fibre Channel protocol device includes:
    (a) pattern recognition logic for receiving the data characters and determining which clock speed corresponds to the data rate of the bitstream, generating control signals indicating the data rate of the bitstream; and
    (b) a deserializer control circuit connected to the pattern recognition logic and to the deserializer, where the deserializer control circuit receives the control signals from the deserializer control circuit, and where the deserializer control circuit sends clock control signals to the deserializer to set the clock speed of the deserializer according to the control signals from the deserializer control circuit.

10. A port for connecting a network device to a network, the port comprising:
    (a) a data input for receiving a bitstream from a network, where the bitstream has a data rate;
    (b) a deserializer connected to the data input, where the deserializer deserializes the bitstream received via the data input, generating data characters; and
    (c) a network device connected to the deserializer, where the network device receives data characters from the deserializer and determines the data rate of the bitstream by recognizing patterns in the data characters generated by the deserializer;
    wherein the deserializer is capable of operating at more than one clock speed.

11. The port of claim 10, where the network uses an 8B/10B encoding scheme.

12. A method of setting a clock speed of a deserializer, comprising:
    (a) setting a clock speed of a deserializer to a maximum speed;
    (b) receiving a bitstream of data at the deserializer;
    (c) deserializing the bitstream into data characters;
    (d) recognizing patterns in the data characters to determine a data rate of the bitstream; and
    (e) setting the clock speed of the deserializer to match the data rate of the bitstream based on the recognized patterns.

13. The method of claim 12, where deserializing the bitstream includes finding a comma pattern in the bitstream.

14. The method of claim 12, where the recognized patterns are based on a K28.5 character.

15. The method of claim 12, where the bitstream is in a Fibre Channel network.

16. The method of claim 12, where the bitstream is in a network using an 8B/10B encoding scheme.

17. A method of setting a clock speed of a deserializer capable of operating at more than one clock speed comprising:
    (a) recognizing patterns in a bitstream by deserializing the bitstream with the deserializer and generating data characters; and
    (b) setting a clock speed of a deserializer based on the recognized patterns.

* * * * *